(12) United States Patent
Kim

(10) Patent No.: US 10,692,805 B2
(45) Date of Patent: Jun. 23, 2020

(54) SEMICONDUCTOR PACKAGE

(71) Applicant: SAMSUNG ELECTRONICS CO., LTD., Suwon-si (KR)

(72) Inventor: Da Hee Kim, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/171,047

(22) Filed: Oct. 25, 2018

(65) Prior Publication Data
US 2019/0206783 A1    Jul. 4, 2019

(30) Foreign Application Priority Data
Jan. 2, 2018  (KR) ........................ 10-2018-0000414

(51) Int. Cl.
H01L 23/495 (2006.01)
H01L 23/498 (2006.01)
(Continued)

(52) U.S. Cl.
CPC ...... H01L 23/49838 (2013.01); H01L 23/053 (2013.01); H01L 23/49822 (2013.01);
(Continued)

(58) Field of Classification Search
CPC ......... H01L 23/49822; H01L 23/49827; H01L 23/49838; H01L 23/49894; H01L 23/053; H01L 24/20; H01L 24/08
(Continued)

(56) References Cited

U.S. PATENT DOCUMENTS 8,669,140 B1 * 3/2014 Muniandy ............. H01L 25/105
257/774
8,810,024 B2 * 8/2014 Lin ........................ H01L 23/13
257/698
(Continued)

FOREIGN PATENT DOCUMENTS

JP    H05-251864 A    9/1993
JP    2005-191113 A    7/2005
(Continued)

OTHER PUBLICATIONS

Office Action issued in corresponding Korean Application No. 10-2018-0000414, dated Mar. 16, 2019.
(Continued)

Primary Examiner — Luan C Thai
(74) Attorney, Agent, or Firm — Sughrue Mion, PLLC

(57) ABSTRACT

A semiconductor package includes a semiconductor chip having a first surface on which connection pads are disposed and a second surface opposing the first surface; a connection member including a first insulating layer disposed on the first surface of the semiconductor chip, a wiring pattern disposed on the first insulating layer and having a top surface of which an edge is rounded, a via penetrating through the first insulating layer and electrically connecting the connection pads to the wiring pattern, and a second insulating layer disposed on the first insulating layer and covering the wiring pattern; and an encapsulant disposed on the connection member and encapsulating the semiconductor chip.

19 Claims, 12 Drawing Sheets

(51) Int. Cl.
*H01L 23/053* (2006.01)
*H01L 23/00* (2006.01)
*H01L 23/31* (2006.01)

(52) U.S. Cl.
CPC .. *H01L 23/49827* (2013.01); *H01L 23/49894* (2013.01); *H01L 24/08* (2013.01); *H01L 24/20* (2013.01); *H01L 23/3128* (2013.01); *H01L 2224/04105* (2013.01); *H01L 2224/08235* (2013.01); *H01L 2224/12105* (2013.01); *H01L 2225/1035* (2013.01); *H01L 2225/1058* (2013.01); *H01L 2225/1088* (2013.01); *H01L 2924/10252* (2013.01); *H01L 2924/10253* (2013.01); *H01L 2924/10329* (2013.01); *H01L 2924/14* (2013.01); *H01L 2924/145* (2013.01); *H01L 2924/1431* (2013.01); *H01L 2924/1432* (2013.01); *H01L 2924/1433* (2013.01); *H01L 2924/1434* (2013.01); *H01L 2924/1436* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01); *H01L 2924/3511* (2013.01)

(58) Field of Classification Search
USPC ......................................................... 257/668
See application file for complete search history.

(56) References Cited

U.S. PATENT DOCUMENTS

| | | | |
|---|---|---|---|
| 9,837,359 | B1 * | 12/2017 | Chiu .................. H01L 23/5389 |
| 2012/0326337 | A1 | 12/2012 | Camacho et al. |
| 2015/0294962 | A1 | 10/2015 | Lin et al. |
| 2016/0218021 | A1 | 7/2016 | Appelt et al. |
| 2016/0338202 | A1 * | 11/2016 | Park .................... H01L 23/5389 |
| 2017/0278766 | A1 | 9/2017 | Kim et al. |
| 2018/0026010 | A1 * | 1/2018 | Huang ................ H01L 25/0657 257/659 |

FOREIGN PATENT DOCUMENTS

| | | |
|---|---|---|
| JP | 2017-123387 A | 7/2017 |
| KR | 10-2017-0112906 A | 10/2017 |

OTHER PUBLICATIONS

Communication dated Feb. 21, 2020, issued by the Taiwan Patent Office in counterpart Taiwan Application No. 107138107.

* cited by examiner

SEMICONDUCTOR PACKAGE

CROSS-REFERENCE TO RELATED APPLICATION(S)

This application claims benefit of priority to Korean Patent Application No. 10-2018-0000414 filed on Jan. 2, 2018 in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

Semiconductor packages have been continuously required to be thinned and lightened in terms of a shape, and have been required to be implemented in a system in package (SiP) form requiring complexation and multifunctionality in terms of a function. In accordance with such a development trend, a fan-out wafer level package (FOWLP) has been recently prominent, and attempts to satisfy requirements of semiconductor packaging by applying several techniques to the FOWLP have been conducted.

In particular, with the commercialization of 5G and IoT (Internet of Things) technologies, the throughput of data increases and communications between semiconductors or devices in the high frequency region is required. To this end, it is required to implement a circuit having a finer pitch than that of a conventional circuit in all devices such as a semiconductor, a semiconductor package, and a main board.

SUMMARY

An aspect of the present disclosure may provide a semiconductor package having redistribution layers of a new shape to ensure a smooth application process for forming an insulating layer.

An aspect of the present disclosure is to change a shape of a pattern constituting a redistribution layer.

According to an aspect of the present disclosure, a semiconductor package may include a semiconductor chip having a first surface on which connection pads are disposed and a second surface opposing the first surface; a connection member including a first insulating layer disposed on the first surface of the semiconductor chip, a wiring pattern disposed on the first insulating layer and having a top surface of which an edge is rounded, a via penetrating through the first insulating layer and electrically connecting the connection pads to the wiring pattern, and a second insulating layer disposed on the first insulating layer and covering the wiring pattern; and an encapsulant disposed on the connection member and encapsulating the semiconductor chip.

According to another aspect of the present disclosure, a semiconductor package may include a support member having a cavity, having first and second surfaces opposing each other, and including a wiring structure connecting the first and second surfaces to each other; a connection member disposed on the second surface of the support member and including an insulating member and a redistribution layer disposed in the insulating member and connected to the wiring structure; a semiconductor chip disposed on the connection member in the cavity and having connection pads connected to the redistribution layer; and an encapsulant encapsulating the semiconductor chip disposed in the cavity and covering the first surface of the support member, wherein the redistribution layer includes a wiring pattern having a first surface which is substantially flat and a second surface opposing the first surface of the wiring pattern and having a rounded edge, and a via electrically connecting the connection pads to the wiring pattern.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Electronic Device

Figure 1:
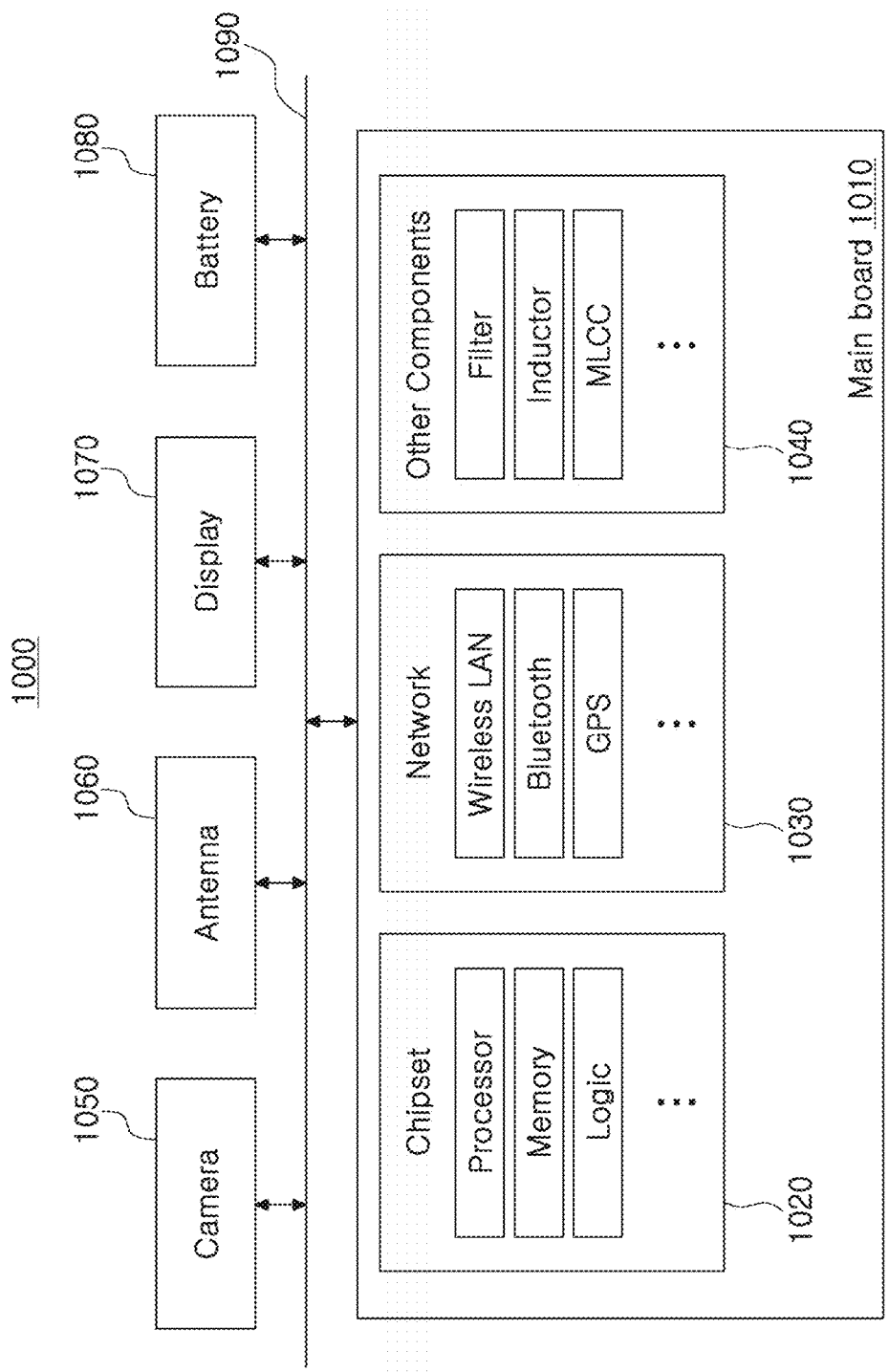
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the main board 1010. These other components may include, for example, a camera 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive, or the like. However, the electronic device 1000 is not limited thereto, but may be any other electronic device processing data.

Figure 2:
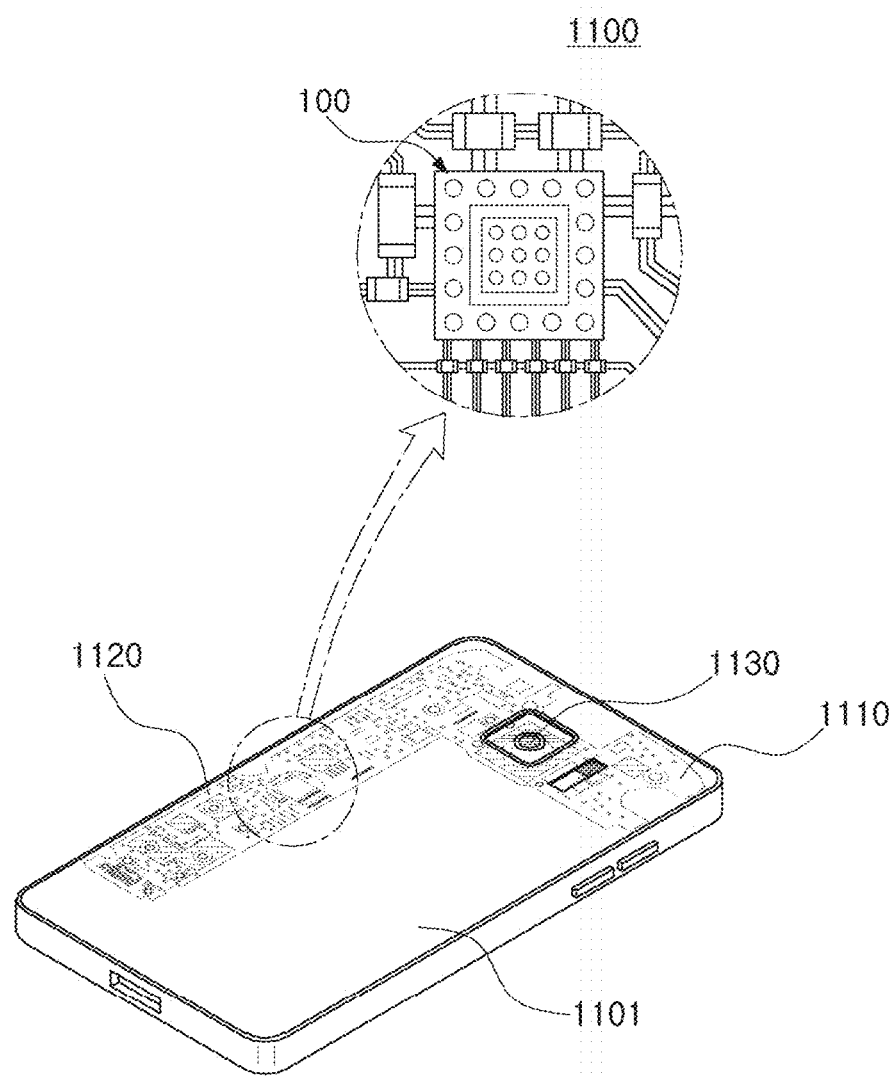
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a mother board 1110 may be accommodated in a body 1101 of a smartphone 1100, and various components 1120 may be physically or electrically connected to the mother board 1110. In addition, other components that may or may not be physically or electrically connected to the main board 1010, such as a camera 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is required is that there is a difference in a circuit width between the semiconductor chip and a main board of the electronic device in terms of electrical connection. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3:
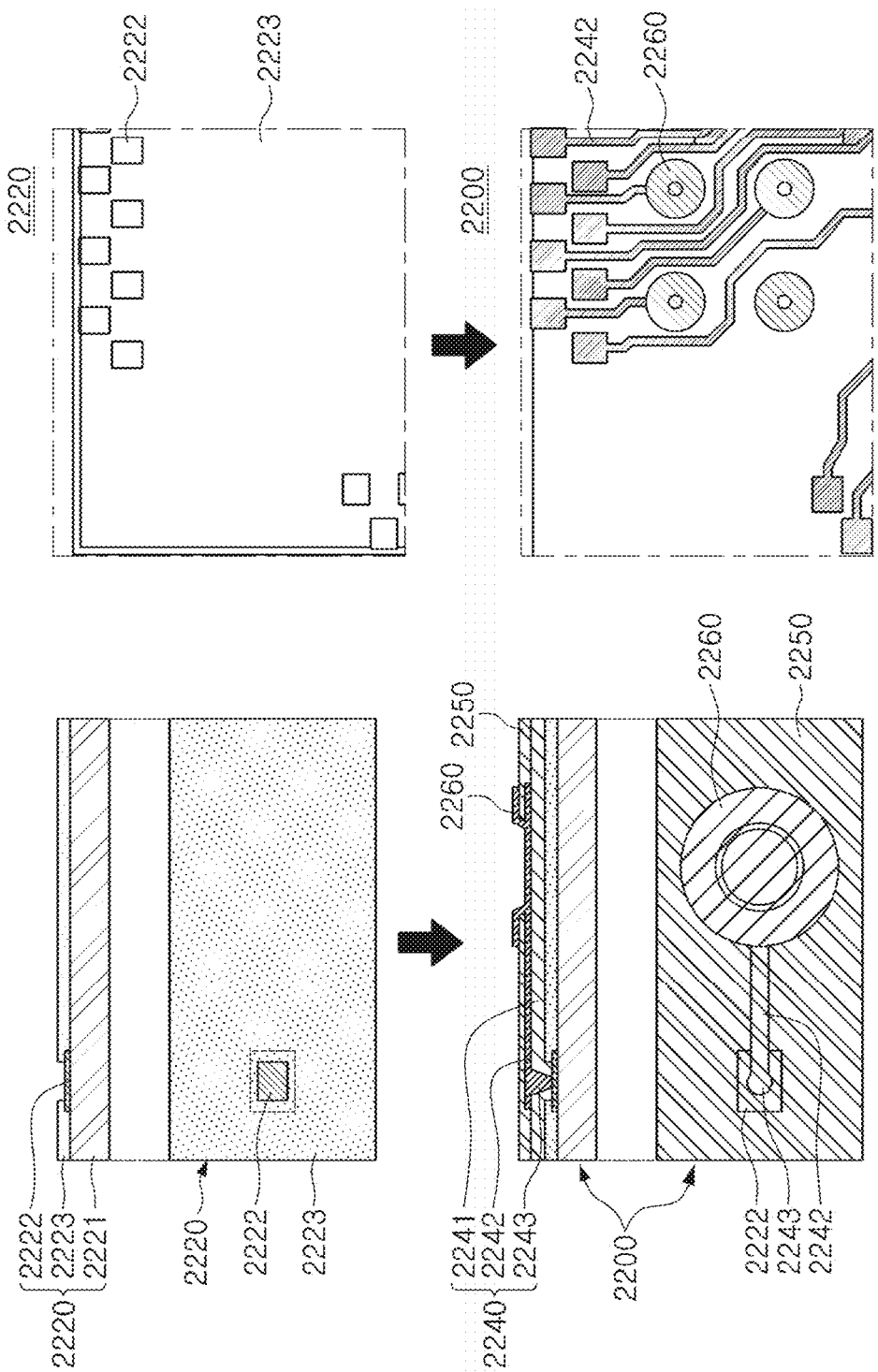
FIGS. 3A and 3B are schematic cross-sectional views illustrating states of a fan-in semiconductor package before and after being packaged.
Figure 4:
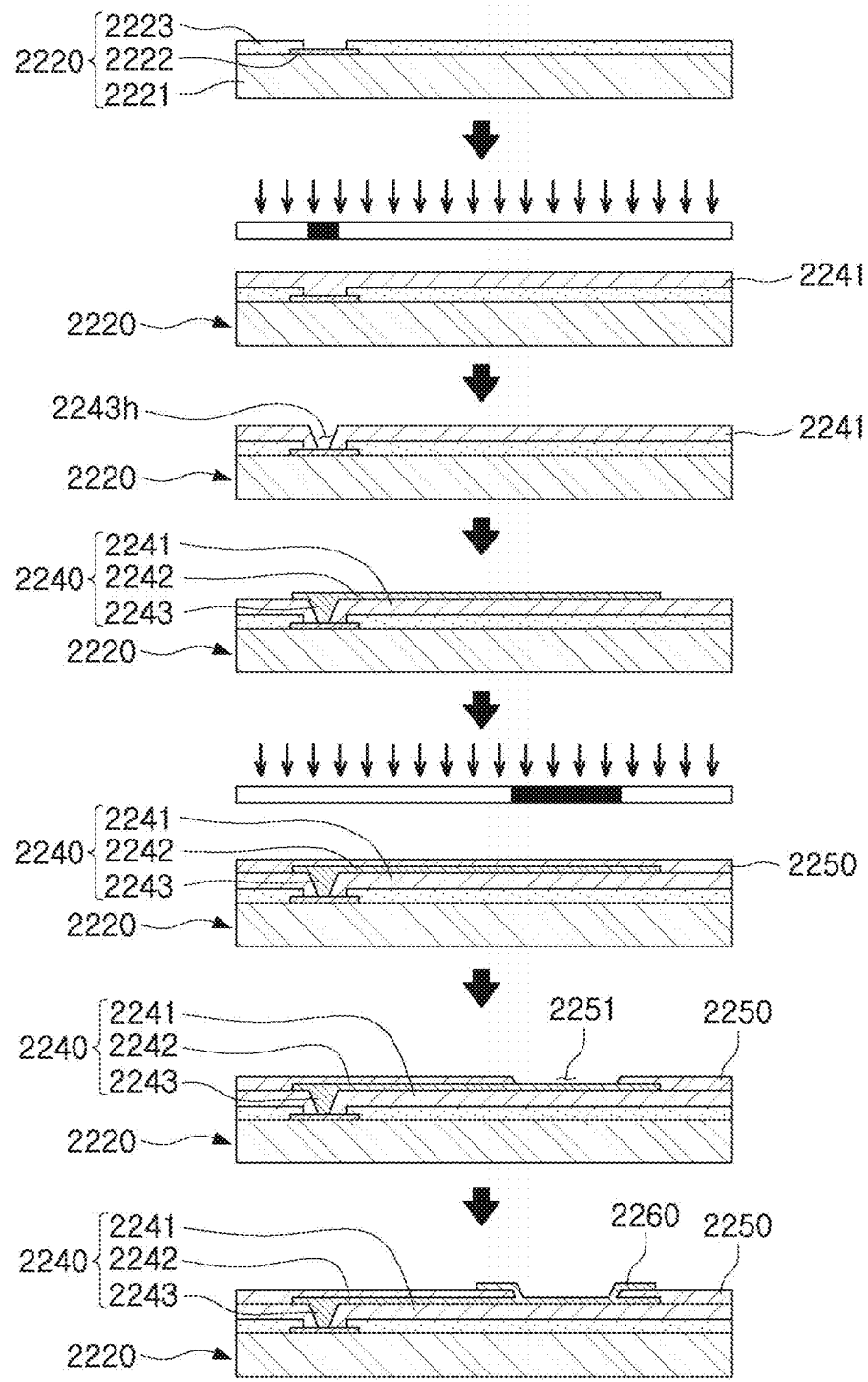
FIG. 4 is a schematic cross-sectional view illustrating a packaging process of a fan-in semiconductor package.

FIGS. 3A and 3B are schematic cross-sectional views illustrating states of a fan-in semiconductor package before and after being packaged, and FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a small size. In addition, due to the disadvantage described above, the fan-in semiconductor package may not be directly mounted and used on the main board of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
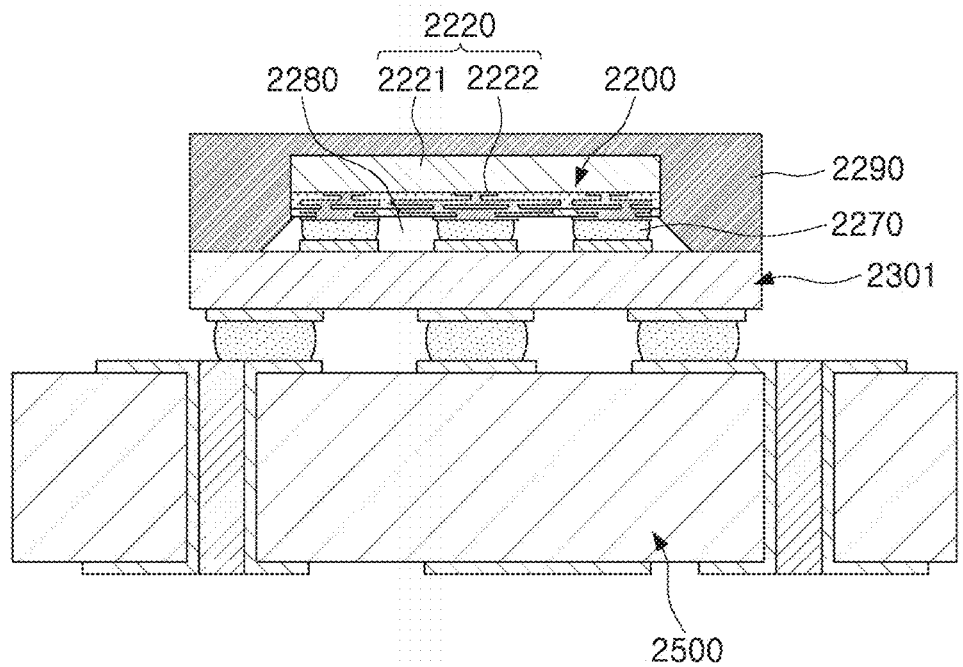
FIG. 5 is a schematic cross-sectional view illustrating a case in which a fan-in semiconductor package is mounted on an interposer substrate and is finally mounted on a main board of an electronic device.
Figure 6:
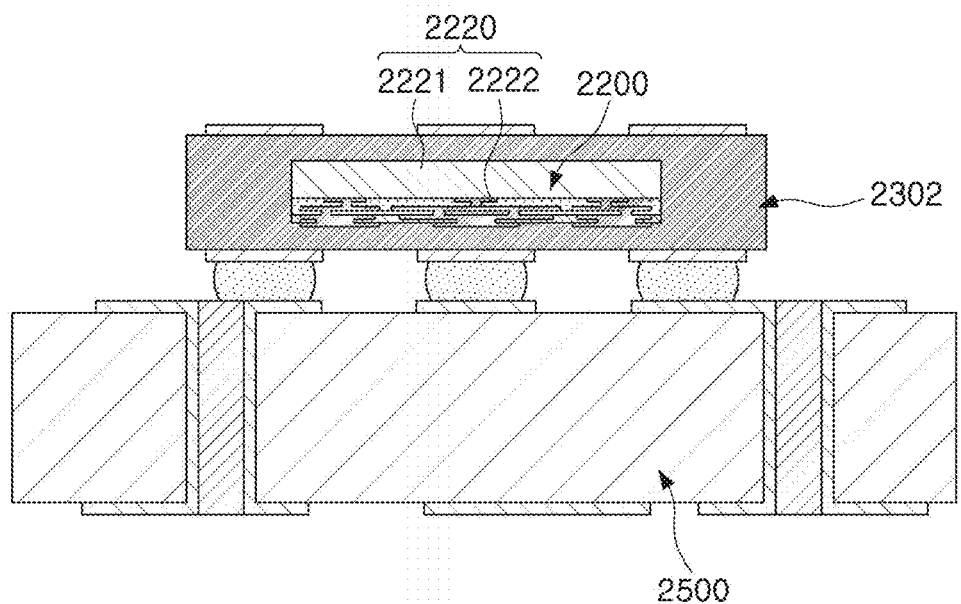
FIG. 6 is a schematic cross-sectional view illustrating a case in which a fan-in semiconductor package is embedded in an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device, and FIG. 6 is a schematic cross-sectional view illustrating a case in which a fan-in semiconductor package is embedded in an interposer substrate and is finally mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be finally mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Figure 7:
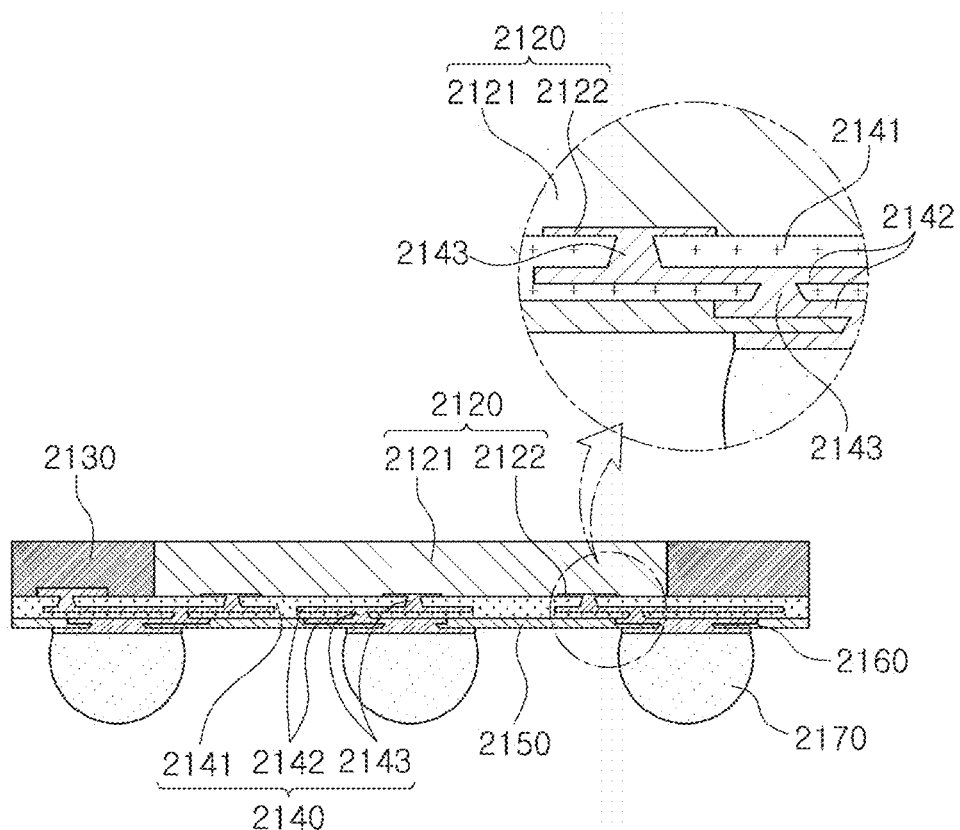
FIG. 7 is a schematic cross-sectional view illustrating a fan-out semiconductor package.

Fan-Out Semiconductor Package FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2241, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for the connection member 2140 is performed from the via connecting the redistribution layers and the connection pads 2122 of the semiconductor chip 2120 to each other and the redistribution layers, and the vias 2143 may thus have a width that becomes small as they become closer to the semiconductor chip (see an enlarged region).

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in the case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
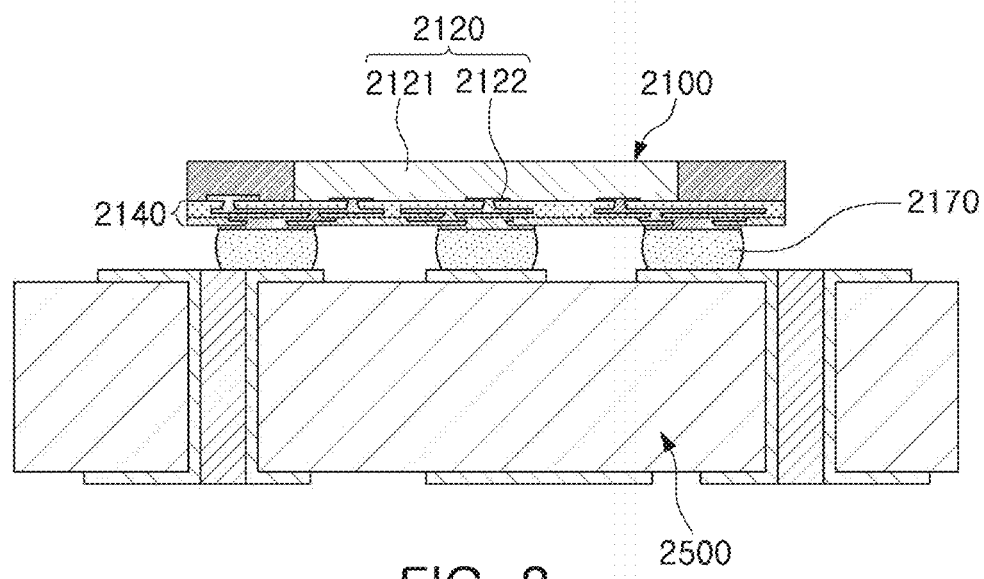
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to FIG. 8, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A semiconductor package capable of smoothly applying a resin for an insulating layer even if patterns of redistribution layers are implemented at a fine pitch will hereinafter be described in detail with reference to the accompanying drawings.

Figure 9:
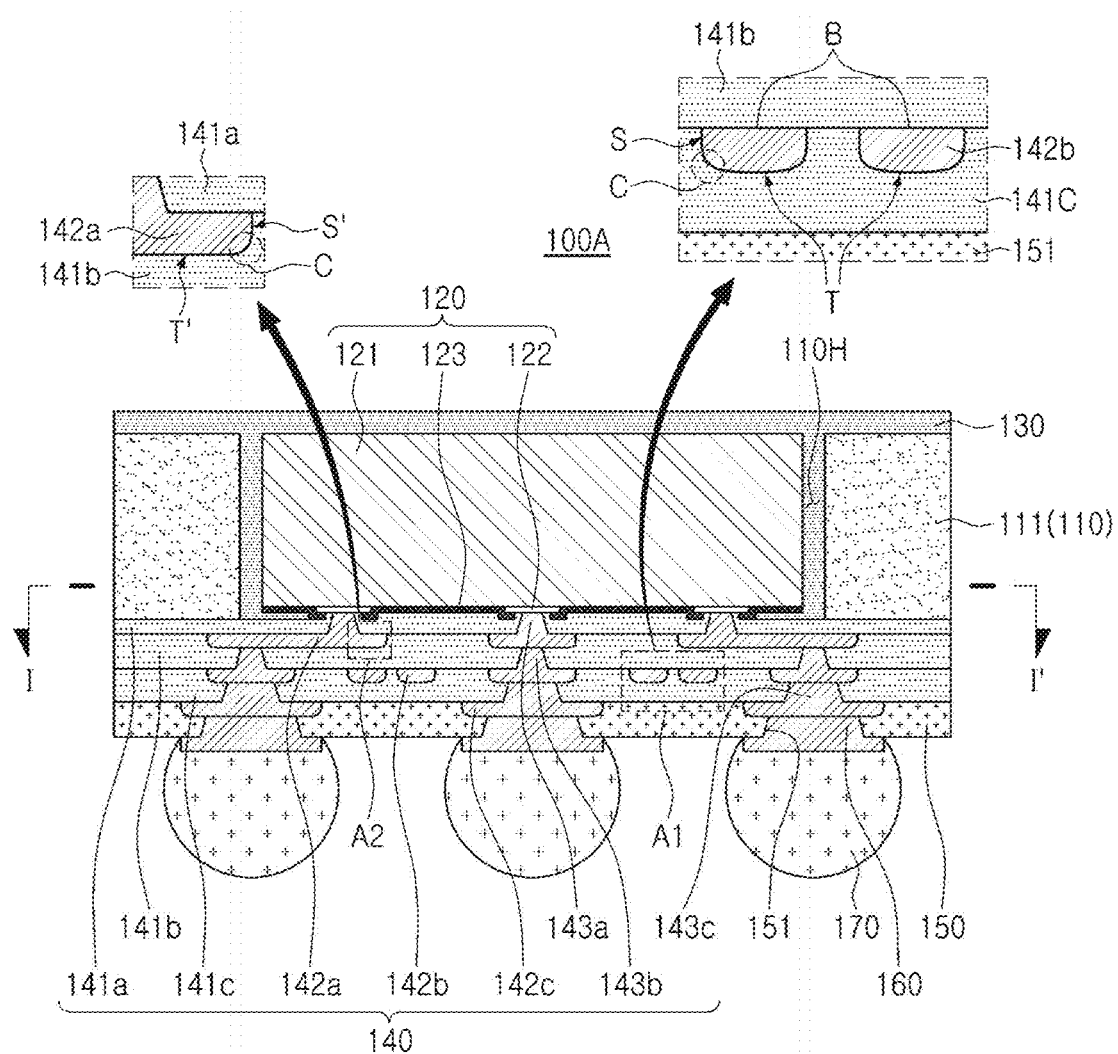
FIG. 9 is a side cross-sectional view illustrating a semiconductor package according to an exemplary embodiment in the present disclosure.
Figure 10:
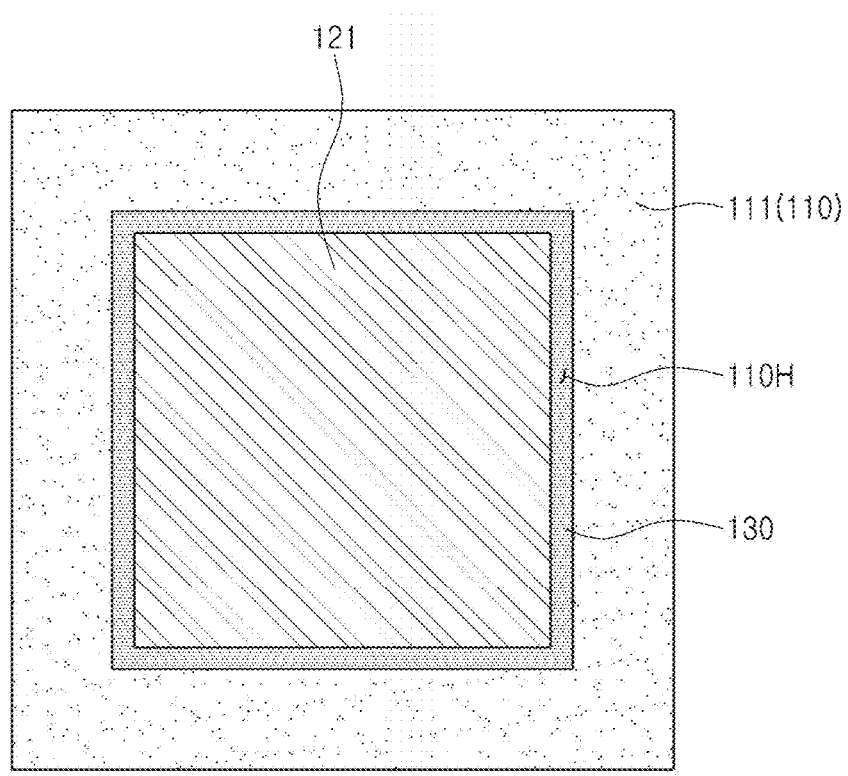
FIG. 10 is a plan view illustrating a semiconductor package illustrated in FIG. 9.

FIG. 9 is a side cross-sectional view illustrating a semiconductor package according to an exemplary embodiment in the present disclosure. FIG. 10 is a plan view illustrating a semiconductor package illustrated in FIG. 9.

Referring to FIGS. 9 and 10, a semiconductor package 100A according to the present exemplary embodiment may include a support member 110 having a cavity 110H, a semiconductor chip 120 disposed in the cavity 110H of the support member 110 and having a first surface on which connection pads 122 are disposed and a second surface disposed to oppose the first surface, an encapsulant 130 encapsulating the support member 110 and the semiconductor chip 120, and a connection member 140 disposed on the support member and the first surface of the semiconductor chip 120.

A passivation layer 150 may be disposed on the connection member 140, and an underbump metal layer 160 may be disposed on an opening 151 of the passivation layer 150. In addition, electrical connection structures 170 connected to the underbump metal layer 160 may be disposed on the passivation layer 150.

According to the present exemplary embodiment, the connection member 140 may have a three-layer redistribution structure including a first wiring layer having a first wiring pattern 142a and a first via 143a, a second wiring layer having a second wiring pattern 142b and a second via 143b, and a third wiring layer having a third wiring pattern 142c and a third via 143c.

Specifically, the connection member 140 may include a first insulating layer 141a disposed on the support member 110 and the first surface of the semiconductor chip 120, a first wiring pattern 142a disposed on the first insulating layer 141a, a first via 143a connecting the first insulating layer 141a and connection pads 122 of the semiconductor chip 120 to each other, a second insulating layer 141b disposed on the first insulating layer 141a to cover the first wiring pattern 142a, a second wiring pattern 142b disposed on the second insulating layer 141b, a second via 143b penetrating through the second insulating layer 141b and connecting the first and second wiring patterns 142a and 142b to each other, a third insulating layer 141c disposed on the second insulating layer 141b to cover the second wiring pattern 143a, a third wiring pattern 142c disposed on the third insulating layer 141c, and a third via 143c penetrating through the third insulating layer 141c and electrically connecting the second and third wiring patterns 142b and 142c to each other.

According to the present exemplary embodiment, as illustrated in FIG. 9, edges of top surfaces of the first to third wiring patterns may have a rounded (or curved) structure C. In the semiconductor package 100A illustrated in FIG. 9, a region of the second wiring pattern 142b arranged at a relatively fine pitch is indicated by "A1".

Referring to the portion of FIG. 9 indicated with A1, a top surface T of the second wiring pattern 142b may have a rounded structure C. Like the second wiring pattern 142b indicated with A, when a width of the pattern is narrow, the wiring pattern may have a dome structure. In the second wiring pattern 142b, a side surface S positioned below the rounded structure C may have an angle of approximately 90° or an angle which is less than 90° with respect to an interface of the second insulating layer 141b and the second wiring pattern 142b.

As described above, the side surface S that is substantially perpendicular to the rounded structure C may help smoothly perform an application process for forming an insulating layer (here, the third insulating layer 141c). For example, when a liquid photosensitive resin such as PID is applied to form the third insulating layer 141c, the resin may not be sufficiently supplied to a narrow interval between the second wiring patterns 142b. According to the present exemplary embodiment, however, the resin may be more smoothly supplied by providing the rounded structure to the top surfaces of the wiring patterns 142a, 142b, and 142c, which are surfaces to which the resin is provided. In addition, the side surfaces C of the wiring patterns 142a, 142b, and 142c are configured to have a vertical angle or an inclined angle which is smaller than the vertical angle, such that the resin may also be more effectively supplied to the pattern regions of the fine pitch. As a result, the problem of voids generated between the patterns of the fine pitch and the lowering of reliability due to the voids may be reduced.

In the present specification, the "top surfaces" of the first to third wiring patterns 142a, 142b, and 142c are surfaces opposing a surface which is in contact with the insulating layer on which the corresponding wiring patterns are formed regardless of an arrangement direction of the semiconductor package 100A, and refer to surfaces to which another insulating layer is applied. Since interfaces of the first to third insulating layers 141a, 141b, and 141c are not distinguished in an actual product, a substantially flat surface may be defined as a bottom surface B (referred to as 'a first surface') and a surface having a rounded edge may be defined as a top surface T (also referred to 'a second surface') in the first to third wiring patterns 142a, 142b, and 142c according to the present exemplary embodiment.

Referring to a portion of FIG. 9 indicated with A2, the top surface T of the first wiring pattern 142a may also have the rounded structure C, but in the case of the pattern having a relatively long length or long width, the rounded structure C of the first wiring pattern 142a indicated with A2 is limited to an edge region, and a top surface T' except for the edge region may be a substantially flat surface. Also in this case, the rounded structure C of the first wiring pattern 142a may smoothly provide the liquid resin for the second insulating layer 141b between the first wiring pattern 142a and another adjacent pattern. Also in the first wiring pattern 142a indicated with A2, similarly to the second wiring pattern 142b described above, a side surface S positioned below the rounded structure C may have an angle of approximately 90° or an angle which is less than 90° with respect to an interface of the first insulating layer 141a and the first wiring pattern 142a.

The rounded structure and the side surface angle as described above may be obtained by a process of forming each of the wiring patterns. Specifically, the rounded structure and a useful side surface angle may be formed by adjusting a lithography process and a plating process using photoresist. This will be described with reference to FIGS. 11A through 11F.

Since the wiring pattern that satisfies the rounded structure and the side surface angle described above are obtained through the same process, the rounded structure and the side surface angle may be applied in a unit of level. In other words, the present exemplary embodiment illustrates a form in which the rounded structure and the side surface angle are applied to all levels of wiring patterns, but the rounded structure and the side surface angle may be applied to only a specific level of wiring pattern with multiple fine pitch designs if necessary and other levels may be formed by a typical method.

The respective components included in the semiconductor package 100A according to the present exemplary embodiment will hereinafter be described in more detail.

The support member 110 may improve rigidity of the semiconductor package 100A, and serve to secure uniformity of a thickness of the encapsulant 130. Wiring structures such as the wiring patterns and vias may be introduced into the support member 110, and in this case, the fan-out semiconductor package 100A may be utilized as a package-on-package (POP) type package. In the cavity 110H, the semiconductor chip 120 may be disposed to be spaced apart from a side wall of the support member 110 by a predetermined distance. Side surfaces of the semiconductor chip 120 may be surrounded by the support member 110. However, such a form is only an example and may be variously modified to have other forms, and the first connection member 110 may perform another function depending on such a form. According to some exemplary embodiments, the support member 110 may be omitted.

The support member 110 may include an insulating layer. A material of the insulating layer may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. When a material having high rigidity such as prepreg including the glass fiber is used as the material of the insulating layer, the support member 110 may also be utilized as a supporter for warpage control of the semiconductor package 100A.

The semiconductor chip 120 may be an integrated circuit (IC) provided in an amount of several hundreds to several millions of elements or more integrated in a single chip. In this case, the IC may be, for example, a processor chip (more specifically, an application processor (AP)) such as a central processor (for example, a CPU), a graphics processor (for example, a GPU), a field programmable gate array (FPGA), a digital signal processor, a cryptographic processor, a microprocessor, a microcontroller, or the like, but is not limited thereto. That is, the IC may be a logic chip such as an analog-to-digital converter, an application-specific IC (ASIC), or the like, or a memory chip such as a volatile memory (for example, a DRAM), a non-volatile memory (for example, a ROM), a flash memory, or the like. In addition, the above-mentioned elements may also be combined with each other and be disposed.

The semiconductor chip 120 may be formed based on an active wafer. In this case, a base material of the body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other required positions. The semiconductor chip 120 may be a bare die, a redistribution layer (not illustrated) may be further formed on the first surface (a surface on which the connection pads 122 are formed) of the semiconductor chip 120, if necessary, and bumps (not illustrated), or the like, may also be connected to the connection pads 122.

The encapsulant 130 may be provided as a structure for protecting the electronic components such as the support member 110, the semiconductor chip 120, and the like. An encapsulation form of the encapsulant 130 is not particularly limited, but may be a form in which the encapsulant 130 surrounds at least portions of the support member 110, the semiconductor chip 120, and the like. For example, the encapsulant 130 may cover the top surface of the support member 110 and the semiconductor chip 120, and fill spaces between walls of the cavity 110H and the side surfaces of the semiconductor chip 120. In addition, the encapsulant 130 may also fill at least a portion of a space between the passivation layer 123 of the semiconductor chip 120 and the connection member 140. The encapsulant 130 may fill the cavity 110H to thus serve as an adhesive and reduce buckling of the semiconductor chip 120 depending on certain materials.

For example, the encapsulant 130 may be a thermosetting resin such as an epoxy resin, a thermoplastic resin such as a polyimide resin, a resin in which the thermosetting resin or the thermoplastic resin is mixed with an inorganic filler, or impregnated together with an inorganic filler in a core material such as a glass fiber, for example, prepreg, Ajinomoto Build-up Film (ABF), FR-4, Bismaleimide Triazine (BT), or the like. According to some exemplary embodiments, a PID resin may also be used.

The connection member 140 may redistribute the connection pads 122 of the semiconductor chip 120. Several tens to several hundreds of connection pads 122 of the semiconductor chip 120 having various functions may be redistributed by the connection member 140, and may be physically or electrically externally connected through the electrical connection structures 170 depending on the functions.

The connection member 140 may be disposed on the support member 110 and the first surface of the semiconductor chip 120 and may have a multilayer redistribution structure other than the three-layer wiring structure according to the present exemplary embodiment. According to some exemplary embodiments, the redistribution structure may also be formed of only a single layer (i.e., one wiring pattern+one via).

The first to third insulating layers 141a, 141b, and 141c used in the connection member 140 may also use a photosensitive insulating material such as a PID resin other than the insulating material described above. According to the present exemplary embodiment, the first to third insulating layers 141a, 141b, and 141c may be photosensitive insulating layers. When the first to third insulating layers 141a, 141b, and 141c has photosensitive properties, the insulating layers 141a, 141b, and 141c may be formed to have a smaller thickness, and fine pitches of the first to third vias 143a, 143b, and 143c may be achieved more easily. The first to third insulating layers 141a, 141b, and 141c may be photosensitive insulating layers including an insulating resin and an inorganic filler. When the first to third insulating layers 141a, 141b, and 141c are multiple layers, the materials of the insulating layers 141a, 141b, and 141c may be the same as each other, and may also be different from each other, if necessary. When the first to third insulating layers 141a, 141b, and 141c are the multiple layers, the first to third insulating layers 141a, 141b, and 141c may be integrated with each other depending on a process, such that a boundary therebetween may also not be apparent. In the first to third insulating layers 141a, 141b, and 141c, a thickness of the insulating layer between the patterns except for the first to third wiring pattern 142a, 142b, and 142c may be about 1 μm to 10 μm.

The first to third wiring patterns 142a, 142b, and 142c may serve to redistribute the connection pads 122 together with the first to third vias 143a, 143b, and 143c. The first to third wiring patterns 142a, 142b, 142c, may include, for example, a conductive material such as copper (Cu), aluminum (Al), silver (Ag), tin (Sn), gold (Au), nickel (Ni), lead (Pb), titanium (Ti), or alloys thereof. The first to third wiring patterns 142a, 142b, and 142c may perform various functions depending on designs of the corresponding layers. For example, the first to third wiring patterns 142a, 142b, and 142c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first to third wiring patterns 142a, 142b, and 142c may include via pad patterns, electrical connection structure pad patterns, and the like. A thickness of each of the first to third wiring patterns 142a, 142b, and 142c may be about 0.5 μm to 15 μm.

The first to third vias 143a, 143b, and 143c may serve to connect (interlayer-connect) the first to third wiring patterns 142a, 142b, and 142c and the connection pads 122 which are formed on different layers to each other in a vertical direction. The first to third vias 143a, 143b, 143c, may include, for example, a conductive material such as copper (Cu), aluminum (Al), silver (Ag), tin (Sn), gold (Au), nickel (Ni), lead (Pb), titanium (Ti), or alloys thereof. The first to third vias 143a, 143b, and 143c may be completely filled with the conductive material, or the conductive material may also be formed along a wall of each of the vias. In addition, each of the first to third vias 143a, 143b, and 143c may have all of the shapes known in the related art, such as a tapered shape, a cylindrical shape, and the like.

The passivation layer 150 may protect the connection member 140 from external physical or chemical damage. The passivation layer 150 may have openings 151 exposing at least portions of the first to third wiring patterns 142a, 142b, and 142c of the connection member 140. The number of openings 151 formed in the passivation layer 150 may be several tens to several thousands. A material of the passivation layer 150 is not particularly limited, but may be the above-mentioned insulating material. For example, the passivation layer 150 may include at least one of prepreg, ABF, FR-4, BT, and solder resist.

The underbump metal layer 160 may improve connection reliability of the electrical connection structures 180 and improve board level reliability of the semiconductor package 100A. The underbump metal layer 160 may be connected to the redistribution layer 142 of the connection member 140 opened through the openings 151 of the passivation layer 150. The underbump metal layer 160 may be formed in the openings 151 of the passivation layer 150 by the known metallization method using the known conductive metal such as a metal, but is not limited thereto.

The electrical connection structures 170 may physically or electrically externally connect the fan-out semiconductor package 100A. For example, the fan-out semiconductor package 100A may be mounted on the main board of the electronic device through the electrical connection structures 170. Each of the electrical connection structures 170 may be formed of a conductive material, for example, a solder, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto. The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 122, or may be provided in an amount of several tens to several thousands or more or several tens to several thousands or less.

When the electrical connection structures 170 are solder balls, the electrical connection structures 170 may cover side surfaces of the underbump metal layer 160 extending onto one surface of the passivation layer 150, and connection reliability may be more excellent.

At least one of the electrical connection structures 170 may be disposed in a fan-out region. The fan-out region is a region except for a region in which the semiconductor chip 120 is disposed. The fan-out package may have reliability greater than that of a fan-in package, may implement a plurality of I/O terminals, and may easily perform 3D interconnection In addition, as compared to a ball grid array (BGA) package, a land grid array (LGA) package, or the like, the fan-out package may be manufactured to have a small thickness.

Meanwhile, although not illustrated in the drawings, a metal thin film may be formed on the walls of the cavity 110H, if necessary, in order to dissipate heat and/or block electromagnetic waves. According to some exemplary embodiments, a plurality of semiconductor chips 120 performing functions that are the same as or different from each other may be disposed in the cavity 110H, if necessary. According to some exemplary embodiments, a separate passive component such as an inductor, a capacitor, or the like, may be disposed in the cavity 110H, if necessary. According to some exemplary embodiments, a passive component, for example, a surface mounted technology (SMT) component including an inductor, a capacitor, or the like, may be disposed on a surface of the passivation layer 150, if necessary.

The rounded structure and the side surface angle of the wiring pattern according to the exemplary embodiment described above may obtained by changing the lithography process and the plating process using the photoresist. FIGS. 11A through 11F are cross-sectional views for describing main processes of a process of forming a circuit pattern according to an exemplary embodiment in the present disclosure.

Figure 11A:
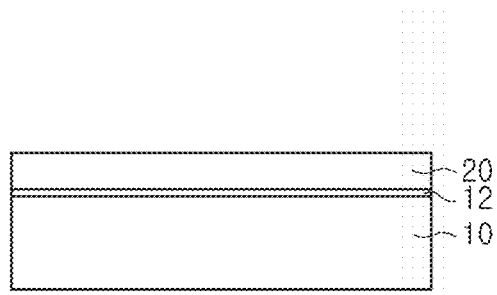
FIGS. 11A through 11F are cross-sectional views for describing main processes of a process of forming a circuit pattern according to an exemplary embodiment in the present disclosure.

Referring to FIG. 11A, a seed layer 12 may be formed on an insulating layer 10 and a photoresist layer 20 may be formed thereon.

The seed layer 12 may be a single layer or a plurality of layers including titanium (Ti), nickel (Ni), copper (Cu), $TiO_2$, tantalum (Ta), $TaO_2$, or the like, but is not limited thereto. The seed layer 12 may be formed by a process such as PVD or a sputtering process. The photoresist layer 20 used in the present exemplary embodiment may use a negative photoresist. That is, in the photoresist layer 20, exposed regions may remain without being removed to provide a pattern. The photoresist layer 20 may be formed by a wet process such as spin on coating or a dry process of applying a dry film.

Figure 11B:
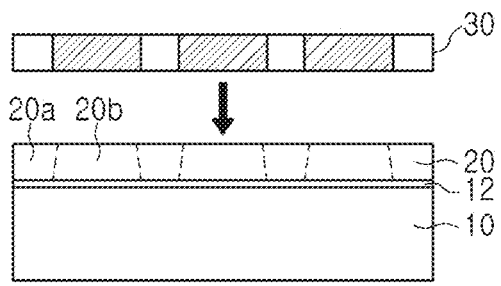
Figure 11C:
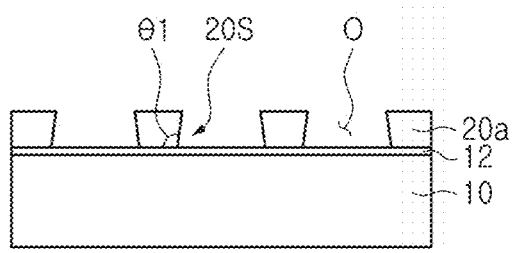

Next, as illustrated in FIG. 11B, an exposure process may be applied to the photoresist layer 20 by using a photomask 30. Slits of the photomask 30 may be used to expose ultraviolet light to a desired region. An exposed region 20a may be cured by the ultraviolet light and an unexposed region 20b may be dissolved and removed using a developer.

Through the above-mentioned exposing/developing process, as illustrated in FIG. 11, a photoresist pattern 20a having open regions O for forming wiring patterns may be prepared. A side surface 20S of the photoresist pattern 20a may be almost perpendicular contrary to the pattern formed by the positive process, or may have an included angle (θ1) of 90° or more due to a reduction of an exposure amount according to a depth.

Figure 11D:
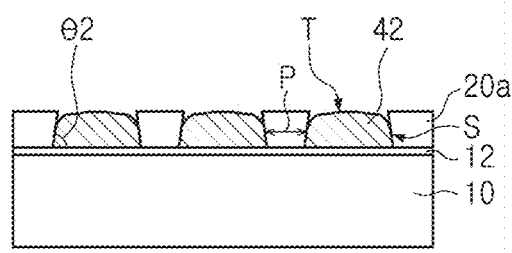

Next, as illustrated in FIG. 11D, a wiring pattern 42 may be formed on the seed layer 12 by a plating process using the photoresist pattern 20a.

The plating process may be performed by electroplating capable of increasing a filling rate. When the plating process having an improved filling rate is performed, the wiring pattern 42 may have a structure in which an edge of a top surface T thereof is rounded, that is, is slightly curved. The plating process having the improved filling rate may be obtained by adjusting conditions of the plating process such as a plating solution, a temperature of the plating solution, and the like.

According to some exemplary embodiments, as the electroplating described above, a dilute sulfuric acid solution may be used as an electrolytic solution at the time of copper plating, and the dilute sulfuric acid solution may have a concentration ranging from 15 to 30%.

The wiring pattern 42 obtained in the present plating process may have a structure in which an edge of a top surface T is rounded by a plating process having a high filling rate, and the wiring pattern 42 having a narrow width according to the present exemplary embodiment may have a dome structure. In addition, since a side surface of the wiring pattern 42 is determined by a side surface 20S of the photoresist pattern, an inclined angle θ2 thereof may have an vertical angle or an angle which is smaller than 90°.

Therefore, an interval P (particularly, an interval in an upper region) between the wiring patterns may be stably secured as compared to the wiring pattern (referring to FIG. 12: a reverse trapezoidal shape) obtained by the conventional positive process.

Figure 11E:
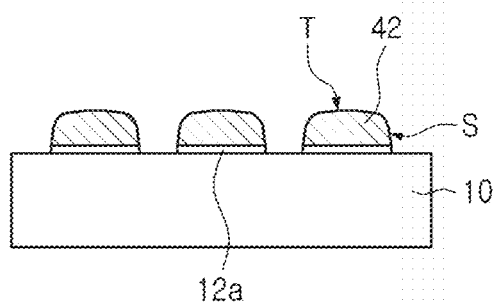

As a result, as illustrated in FIG. 11E, the photoresist pattern 20a may be removed and portions of the seed layer 12 between the wiring patterns 42 may be removed.

After the wiring pattern 42 is formed, the photoresist pattern 20a may be removed by a lift-off process. For example, the photoresist pattern 20a may also be removed by using an appropriate process such as an asking process, an etching process, or a combination thereof. Additionally, the portions of the seed layer 12 between the wiring patterns 42 may be removed through a front etching process. Even if the front etching process is applied, since it is sufficient to remove a thin seed layer 12, the portions of the seed layer between the wiring patterns 42 may be removed without significantly affecting the wiring patterns 42.

Figure 11F:
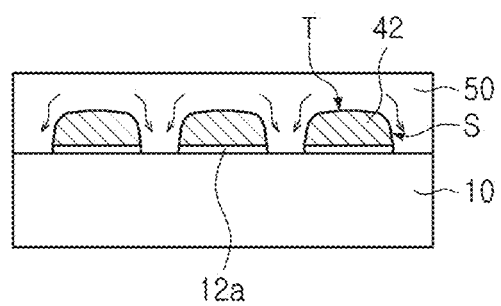

Next, referring to FIG. 11F, an additional insulating layer 50 may be formed by applying an insulating material to the insulating layer 10 on which the wiring patterns 42 are formed.

The present process may be performed by a process of applying the insulating material, but is not limited thereto, and various deposition processes or lamination processes may be used. Since the wiring pattern according to the present exemplary embodiment has a structure in which the top surface thereof is rounded, the insulating material may be more easily introduced into the spaces between the wiring patterns along the top surfaces of the wiring patterns. Thereby, the insulating layer may be effectively filled in the spaces between the wiring patterns of a fine pitch.

For example, even in a case in which the wiring patterns 42 are arranged at a pitch of 10 μm or less, the semiconductor package may be manufactured so that there is almost no void having a size of 2 μm or more in a portion of the insulating layer 50 located between some wiring patterns 42.

Figure 12A:
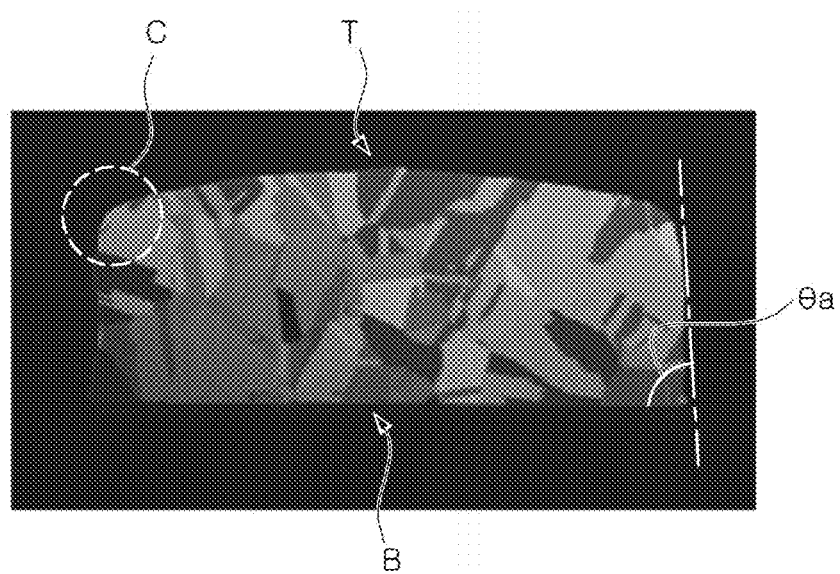
FIGS. 12A and 12B are photographed photographs of a cross section of the circuit pattern.
Figure 12B:
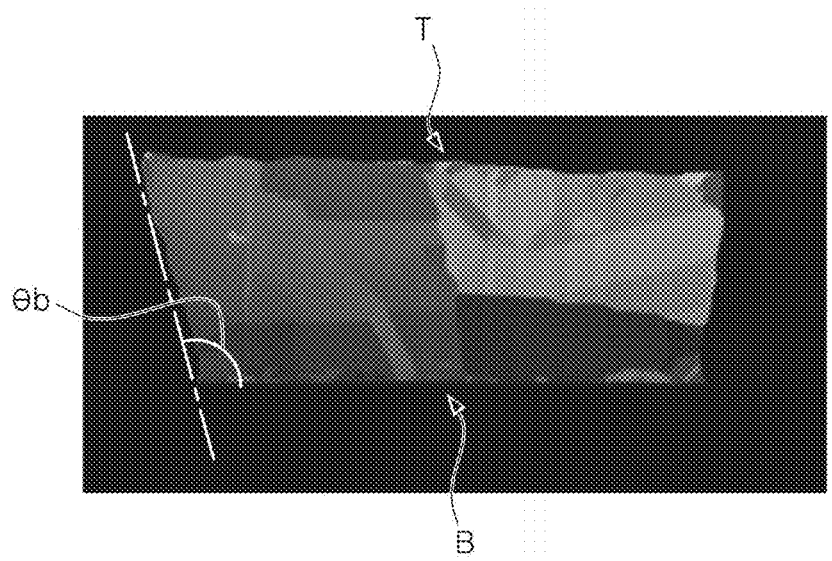

Cross section photographs of the wiring pattern according to the present exemplary embodiment and the related art are illustrated in FIGS. 12A and 12B.

Referring to FIG. 12A, a wiring pattern obtained by performing a patterning using the negative photoresist and performing the plating process using the dilute sulfuric acid solution according to the present exemplary embodiment may be confirmed. The wiring pattern of FIG. 12A may have a first surface B which is substantially flat and a second surface T disposed to oppose the first surface B and having a rounded edge C. An inclined angle θa of a side surface of the wiring pattern shows an approximately vertical angle or a slightly acute angle.

On the other hand, referring to FIG. 12B, a wiring pattern obtained by using the positive photoresist and a typical plating process may be confirmed. Both surfaces T and B of the wiring pattern of FIG. 12B are flat and an inclined angle θb of a side surface of the wiring pattern shows an obtuse angle which is close to about 100°.

Therefore, in the case of the wiring patterns of FIG. 12B, when the wiring patterns have a narrow pitch, the insulating material is not smoothly introduced into the spaces between the wiring patterns, and since an interval between the wiring patterns becomes narrower at an upper region, signal interference between the wiring patterns may severely occur, but in the case of the wiring patterns of FIG. 12A, even if the wiring patterns are arranged at a narrow pitch, the insulating material may be effectively introduced into the spaces between the wiring patterns through gently curved top surfaces thereof, and since the interval between the wiring patterns is sufficiently secured at the upper region, the problem of signal interference may be reduced.

Figure 13:
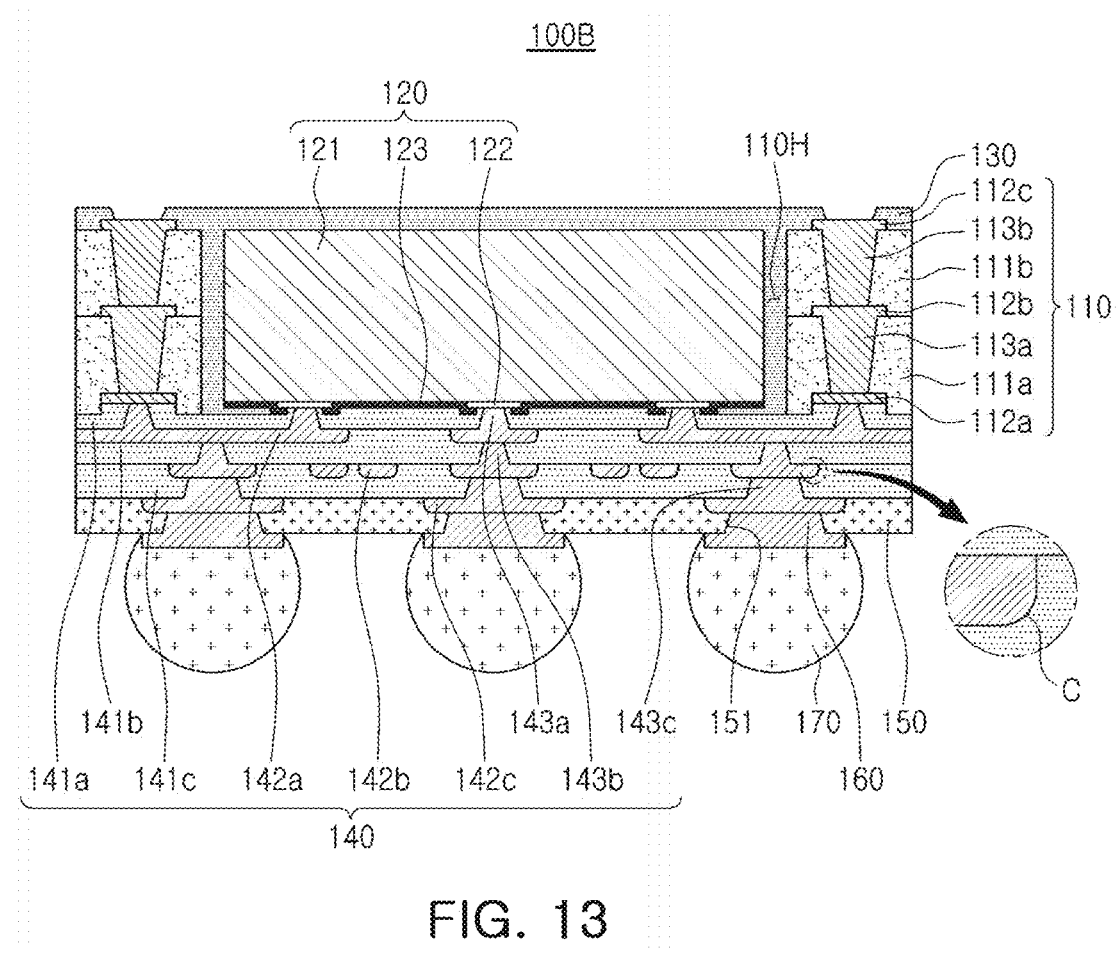
FIGS. 13 and 14 are side cross-sectional views illustrating a semiconductor package according to various exemplary embodiments in the present disclosure.
Figure 14:
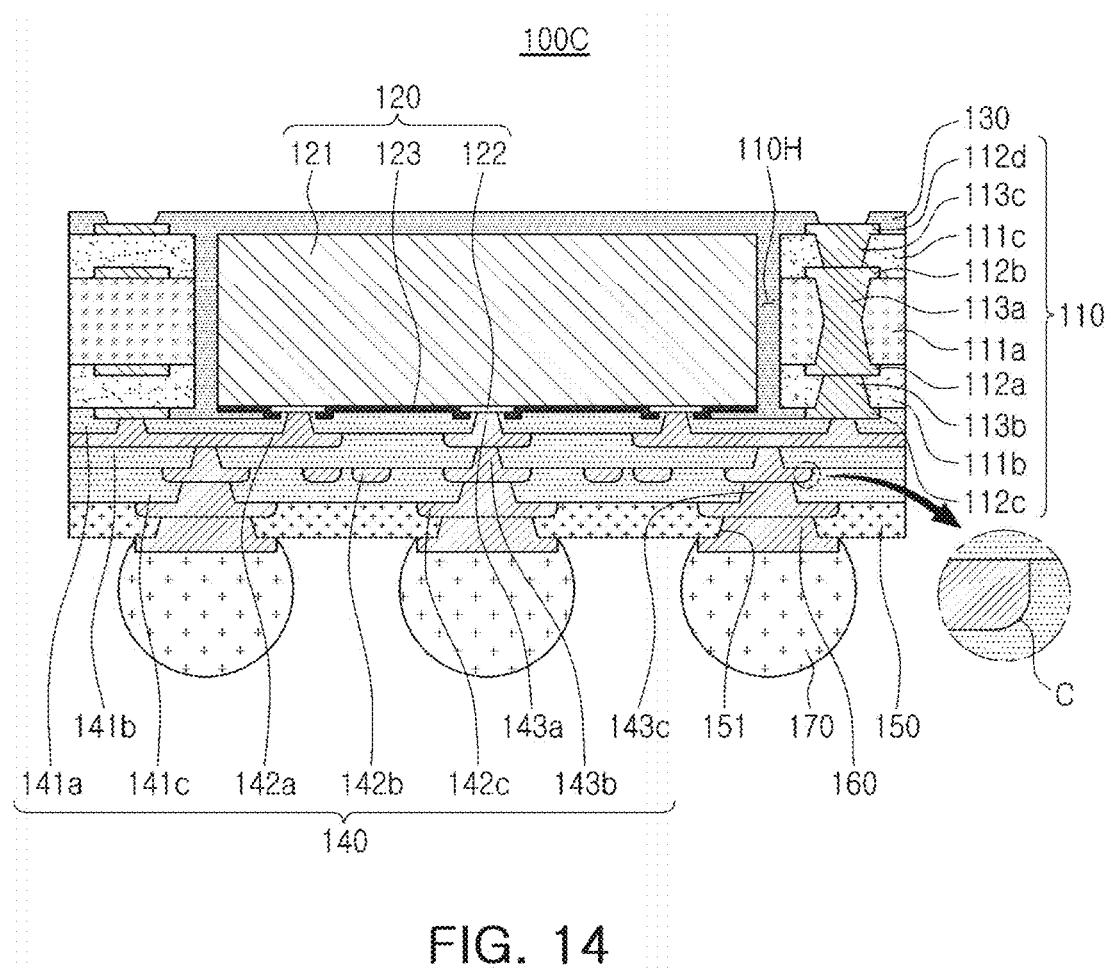

FIGS. 13 and 14 are side cross-sectional views illustrating a semiconductor package according to various exemplary embodiments in the present disclosure.

FIG. 13 is a schematic cross-sectional view illustrating another example of a semiconductor package.

Referring to FIG. 13, a semiconductor package 100B according to the present embodiment may be understood to be similar to the structure illustrated in FIGS. 9 and 10, except that a support member 110 having a wiring structure is employed. Components according to the present exemplary embodiment may be understood with reference to the description for the same or similar components of the semiconductor package 100A illustrated in FIGS. 9 and 10 unless explicitly described to the contrary.

The support member 110 may include a first dielectric layer 111a in contact with a connection member 140, a first wiring layer 112a in contact with the connection member 140 and embedded in the first dielectric layer 111a, a second wiring layer 112b disposed on the other surface of the first dielectric layer 111a opposing one surface of the first dielectric layer 111a in which the first wiring layer 112a is embedded, a second dielectric layer 111b disposed on the first dielectric layer 111a and covering the second wiring layer 112b, and a third wiring layer 112c disposed on the second dielectric layer 111b. The first to third wiring layers 112a, 112b, and 112c may be electrically connected to connection pads 122. The first and second wiring layers 112a and 112b and the second and third wiring layers 112b and 112c may be electrically connected to each other through first and second vias 113a and 113b penetrating through the first and second dielectric layers 111a and 111b, respectively.

When the first wiring layer 112a is embedded in the first dielectric layer 111a as in the present exemplary embodiment, a step generated due to a thickness of the first wiring layer 112a may be significantly reduced, and an insulating distance of the connection member 140 may thus become constant. That is, a difference between a distance from a first wiring pattern 142a of the connection member 140 to a lower surface of the first dielectric layer 111a and a distance from the first wiring pattern 142a of the connection member 140 to the connection pad 122 of a semiconductor chip 120 may be smaller than a thickness of the first wiring layer 112a. Therefore, a high density wiring design of the connection member 140 may be easy.

The lower surface of the first wiring layer 112a of the support member 110 may be disposed on a level above a lower surface of the connection pad 122 of a semiconductor chip 120. In addition, a distance between the first wiring pattern 142a of the connection member 140 and the wiring pattern 112a of the support member 110 may be greater than that between the first wiring layer 142a of the connection member 140 and the connection pad 122 of the semiconductor chip 120. The reason is that the first wiring layer 112a may be recessed into the first dielectric layer 111a.

As described above, when the first wiring layer 112a is recessed into the first insulating layer 141a, such that the lower surface of the first dielectric layer 111a and the lower surface of the first wiring layer 112a have a step therebetween, a phenomenon in which a material of the encapsulant 130 bleeds to pollute the first wiring layer 112a may be prevented. The second wiring layer 112b of the support member 110 may be disposed between an active surface and an inactive surface of the semiconductor chip 120. The support member 110 may be formed at a thickness corresponding to that of the semiconductor chip 120. Therefore, the second wiring layer 112b formed in the support member 110 may be disposed on a level between the active surface and the inactive surface of the semiconductor chip 120.

Thicknesses of the wiring layers 112a, 112b, and 112c of the support member 110 may be greater than those of the wiring layers 142a, 142b, and 142c of the connection member 140. Since the support member 110 may have a thickness equal to or greater than that of the semiconductor chip 120, the wiring layers 112a, 112b, and 112c may be formed at larger sizes depending on a scale of the support member 110. On the other hand, the redistribution layers 142a, 142b, and 142c of the connection member 140 may be formed at sizes relatively smaller than those of the wiring layers 112a, 112b, and 112c for thinness.

A material of the dielectric layers 111a and 111b is not particularly limited and may be, for example, a thermosetting resin such as an epoxy resin, a thermoplastic resin such as a polyimide resin, a resin in which the thermosetting resin or the thermoplastic resin is mixed with an inorganic filler, or impregnated together with an inorganic filler in a core material such as a glass fiber, for example, prepreg, Ajinomoto Build-up Film (ABF), FR-4, Bismaleimide Triazine (BT), or the like. According to some exemplary embodiments, a PID resin may also be used.

The wiring layers 112a, 112b, and 112c may serve to redistribute the connection pads 122 of the semiconductor chip 120. For example, each of the wiring layers 112a, 112b, and 112c may include copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of their corresponding layers. For example, the wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, and 112c may include via pads, wire pads, electrical connection structure pads, and the like.

The vias 113a and 113b may electrically connect the wiring layers 112a, 112b, and 112c formed on different layers to each other, resulting in an electrical path in the support member 110. A material of each of the vias 113a and 113b may be a conductive material. Each of the vias 113a and 113b may be completely filled with a conductive material, or a conductive material may also be formed along a wall of each of via holes. In addition, each of the vias 113a and 113b may have all of the shapes known in the related art, such as a tapered shape, a cylindrical shape, and the like. When holes for the first vias 113a are formed, some pads of the first wiring layer 112a may serve stoppers. It may be advantageous in a process that the first via 113 has a tapered shape of which a width of an upper surface is greater than that of a lower surface. In this case, the first vias 113a may be integrated with pad patterns of the second wiring layer 112b. In addition, when holes for the second vias 113b are formed, some of the pads of the second wiring layer 112b may serve as a stopper, and it may thus be advantageous in a process that each of the second vias 113b has the tapered shape of which a width of an upper surface is greater than that of a lower surface. In this case, the second vias 113b may be integrated with pad patterns of the third wiring layer 112c.

Top surfaces of the wiring patterns 142a, 142b, and 142c employed in the present exemplary embodiment may have a rounded structure C. In addition, side surfaces of the wiring patterns 142a, 142b, and 142c may have a vertical angle or an inclined angle which is smaller than the vertical angle. Therefore, even if the wiring patterns 142a, 142b, and 142c are arranged at a narrow pitch, the insulating material may be effectively introduced into the spaces between the wiring patterns 142a, 142b, and 142c through the gently curved top surfaces in the process for forming the insulating layer, and since the interval between the wiring patterns is sufficiently secured at the upper region, the problem of signal interference may be reduced.

The rounded structure C described above may be applied to the wiring layers 112a, 112b, and 112c similarly to the wiring patterns 142a, 142b, and 142c. That is, the rounded structure C and the inclined angle of the side surface may be implemented by changing the lithography process and the plating process using the negative photoresist.

FIG. 14 is a schematic cross-sectional view illustrating another example of a semiconductor package.

Referring to FIG. 14, a semiconductor package 100C according to the present embodiment may be understood to be similar to the structure illustrated in FIGS. 9 and 10, except that a support member 110 having a wiring structure is employed. Components according to the present exemplary embodiment may be understood with reference to the description for the same or similar components of the semiconductor package 100A illustrated in FIGS. 9 and 10 unless explicitly described to the contrary.

In the semiconductor package 100C according to the present exemplary embodiment, a support member 110 may include a first dielectric layer 111a, a first wiring layer 112a and a second wiring layer 112b disposed on opposite surfaces of the first dielectric layer 111a, respectively, a second dielectric layer 111b disposed on the first dielectric layer 111a and covering the first wiring layer 112a, a third wiring layer 112c disposed on the second dielectric layer 111b, a third dielectric layer 111c disposed on the first dielectric layer 111a and covering the second wiring layer 112b, and a fourth wiring layer 112d disposed on the third dielectric layer 111c. The first to fourth wiring layers 112a, 112b, 112c, and 112d may be electrically connected to connection pads 122.

Since the support member 110 may include a large number of wiring layers 112a, 112b, 112c, and 112d, a connection member 140 may be further simplified. Therefore, a decrease in a yield depending on a defect occurring in a process of forming the connection member 140 may be suppressed. Meanwhile, the first to fourth wiring layers 112a, 112b, 112c, and 112d may be electrically connected to each other through first to third vias 113a, 113b, and 113c respectively penetrating through the first to third dielectric layers 111a, 111b, and 111c.

The first dielectric layer 111a may have a thickness greater than those of the second dielectric layer 111b and the third dielectric layer 111c. The first dielectric layer 111a may be basically relatively thick in order to maintain rigidity, and the second dielectric layer 111b and the third dielectric layer 111c may be introduced in order to form a larger number of wiring layers 112c and 112d. The first dielectric layer 111a may include an insulating material different from those of the second dielectric layer 111b and the third dielectric layer 111c. For example, the first dielectric layer 111a may be, for example, prepreg including a core material, a filler, and an insulating resin, and the second dielectric layer 111b and the third dielectric layer 111c may be an ABF film or a PID film including a filler and an insulating resin. However, the materials of the first dielectric 111a and the second and third dielectric layers 111b and 111c are not limited thereto. Similarly, the first vias 113a penetrating through the first dielectric layer 111a may have a diameter greater than those of second vias 113b and third vias 113c respectively penetrating through the second and third dielectric layers 111b and 111c.

A lower surface of the third wiring layer 112c of the support member 110 may be disposed on a level below a lower surface of the connection pad 122 of a semiconductor chip 120. In addition, a distance between a first wiring pattern 142a of the connection member 140 and the third wiring layer 112c of the support member 110 may be smaller than that between the first wiring pattern 142a of the connection member 140 and the connection pad 122 of the semiconductor chip 120.

The reason is that the third wiring layer 112c may be disposed in a protruding form on the second dielectric layer 111b, resulting in being in contact with the connection member 140. The first wiring layer 112a and the second wiring layer 112b of the support member 110 may be disposed on a level between an active surface and an inactive surface of the semiconductor chip 120. The support member 110 may be formed at a thickness corresponding to that of the semiconductor chip 120. Therefore, the first wiring layer 112a and the second wiring layer 112b formed in the support member 110 may be disposed on a level between the active surface and the inactive surface of the semiconductor chip 120.

Thicknesses of the wiring layers 112a, 112b, 112c, and 112d of the support member 110 may be greater than those of the redistribution layers 142a, 142b, and 142c of the connection member 140. Since the support member 110 may have a thickness equal to or greater than that of the semiconductor chip 120, the wiring layers 112a, 112b, 112c, and 112d may also be formed at larger sizes. On the other hand, the wiring patterns 142a, 142b, and 142c of the connection member 140 may be formed at relatively small sizes for thinness.

Top surfaces of the wiring patterns 142a, 142b, and 142c employed in the present exemplary embodiment may have a rounded structure C. In addition, side surfaces of the wiring patterns 142a, 142b, and 142c may have a vertical angle or an inclined angle which is smaller than the vertical angle. Therefore, even if the wiring patterns 142a, 142b, and 142c are arranged at a narrow pitch, the insulating material may be effectively introduced into the spaces between the wiring patterns 142a, 142b, and 142c through the gently curved top surfaces in the process for forming the insulating layer, and since the interval between the wiring patterns is sufficiently secured at the upper region, the problem of signal interference may be reduced.

The rounded structure C described above may be applied to the wiring layers 112a, 112b, 112c, and 112d similarly to the wiring patterns 142a, 142b, and 142c. That is, the rounded structure C and the inclined angle of the side surface may be implemented by changing the lithography process and the plating process using the negative photoresist.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to an exemplary embodiment in the present disclosure, an edge of a top surface of a pattern of a fine pitch constituting a redistribution layer has a rounded structure, so that a smooth filling between the patterns may be achieved in an application process of an insulating layer. Further, a substantial interval between the patterns may be secured by configuring the pattern so that an inclined angle of a side surface thereof is a vertical angle or an angle lower than the vertical angle, thereby reducing undesired signal interference between the patterns.

While exemplary embodiments have been shown and described above, it will be apparent to those skilled in the art that modifications and variations could be made without departing from the scope of the present invention as defined by the appended claims.

What is claimed is:

1. A semiconductor package comprising:
 a semiconductor chip having a first surface on which connection pads are disposed and a second surface opposing the first surface; and
 a connection member including a first insulating layer disposed on the first surface of the semiconductor chip, a first wiring pattern disposed on the first insulating layer and having a top surface of which an edge is rounded, a first via penetrating through the first insulating layer and electrically connecting the connection pads to the first wiring pattern, and a second insulating layer disposed on the first insulating layer and covering the first wiring pattern,
 wherein a side surface of the first wiring pattern has an angle of 90° or smaller with respect to an interface of the first insulating layer and the first wiring pattern, and
 wherein a portion of the first wiring pattern has a pitch of 10 μm or less.

2. The semiconductor package of claim 1, wherein the first wiring pattern has a substantially domed shape.

3. The semiconductor package of claim 1, wherein
 a void having a size of 2 μm or more does not exist in the insulating layer between the some of the first wiring pattern.

4. The semiconductor package of claim 1, wherein the first and second insulating layers include a photosensitive insulating resin.

5. The semiconductor package of claim 4, wherein the second insulating layer includes an insulating resin which is cured from a liquid resin.

6. The semiconductor package of claim 1, wherein the first wiring pattern includes copper (Cu).

7. The semiconductor package of claim 1, wherein the connection member further includes a second wiring pattern disposed on the second insulating layer and having a top surface of which an edge is rounded, a second via electrically connecting the first wiring pattern to the second wiring pattern, and a third insulating layer disposed on the second insulating layer and covering the second wiring pattern.

8. The semiconductor package of claim 1, further comprising a support member having a first surface disposed on the connection member and a second surface opposing the first surface of the support member, and having a cavity in which the semiconductor chip is accommodated.

9. The semiconductor package of claim 8, wherein the support member has a wiring structure that connects the first surface and the second surface to each other, and is electrically connected to the first wiring pattern.

10. The semiconductor package of claim 8, wherein the 10 support member includes a lower insulating layer, a first redistribution layer in contact with the connection member and embedded in the lower insulating layer, and a second redistribution layer disposed on the other surface of the lower insulating layer opposing one surface of the lower insulating layer in which the first redistribution layer is embedded, and
 the first and second redistribution layers are electrically connected to the connection pads at least through the first wiring pattern of the connection member.

11. The semiconductor package of claim 10, wherein the support member further includes an upper insulating layer disposed on the lower insulating layer and covering the second redistribution layer and a third redistribution layer disposed on the upper insulating layer, and the third redistribution layer is electrically connected to the connection pads at least through the first wiring pattern of the connection member.

12. The semiconductor package of claim 8, wherein the support member includes a middle insulating layer, a first redistribution layer and a second redistribution layer disposed on opposite surfaces of the middle insulating layer, respectively, a lower insulating layer disposed on the middle insulating layer and covering the first redistribution layer, and a third redistribution layer disposed on the lower insulating layer, and the first to third redistribution layers are electrically connected to the connection pads at least through the first wiring pattern of the connection member.

13. The semiconductor package of claim 12, wherein the support member further includes an upper insulating layer disposed on the middle insulating layer and covering the second redistribution layer and a fourth redistribution layer disposed on the upper insulating layer, and the fourth redistribution layer is electrically connected to the connection pads at least through the first wiring pattern of the connection member.

14. The semiconductor package of claim 1, further comprising an encapsulant disposed on the connection member and encapsulating the semiconductor chip.

15. A semiconductor package comprising:

a support member having a cavity, having first and second surfaces opposing each other, and including a wiring structure connecting the first and second surfaces to each other;

a connection member disposed on the second surface of the support member and including an insulating member and a redistribution layer disposed in the insulating member and connected to the wiring structure;

a semiconductor chip disposed on the connection member in the cavity and having connection pads connected to the redistribution layer; and an encapsulant encapsulating the semiconductor chip disposed in the cavity and covering the first surface of the support member, wherein the redistribution layer includes a wiring pattern having a first surface which is substantially flat and a second surface opposing the first surface of the wiring pattern and having a rounded edge, and a via electrically connecting the connection pads to the wiring pattern, wherein a side surface of the wiring pattern has an angle of 90° or smaller with respect to an interface of the insulating member and the wiring pattern, and wherein a portion of the first wiring pattern has a pitch of 10 μm or less.

16. The semiconductor package of claim 15, wherein the wiring pattern includes a plurality of wiring patterns disposed on different levels in the insulating member, and the via includes a plurality of vias connecting the plurality of wiring pattern disposed on the different levels to each other.

17. A semiconductor package comprising:

a semiconductor chip having a first surface on which a connection pad is disposed and a second surface opposing the first surface; and a connection member including an insulating layer disposed on the first surface of the semiconductor chip, a wiring pattern disposed on the insulating layer, and a via penetrating the insulating layer and extending from the wiring pattern towards the semiconductor chip along a first direction, wherein a width of the wiring pattern increases along the first direction, and a width of the via decreases along the first direction, wherein a side surface of the wiring pattern has an angle of 90° or smaller with respect to an interface of the insulating layer and the wiring pattern, and wherein a portion of the first wiring pattern has a pitch of 10 μm or less.

18. The semiconductor package of claim 17, wherein the wiring pattern has a substantially domed shape.

19. The semiconductor package of claim 17, wherein the wiring pattern includes an upper surface in contacting with the insulating layer and a lower surface opposing the upper surface, and the lower surface is a flat surface.

* * * * *